(12) United States Patent
Tao et al.

(10) Patent No.: US 6,620,631 B1
(45) Date of Patent: *Sep. 16, 2003

(54) PLASMA ETCH METHOD FOR FORMING PATTERNED LAYER WITH ENHANCED CRITICAL DIMENSION (CD) CONTROL

(75) Inventors: Hun-Jan Tao, Hsin-Chu (TW); Chia-Shiung Tsai, Hsin-Chu (TW); Anthony Yen, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 09/573,807

(22) Filed: May 18, 2000

(51) Int. Cl.[7] ............................................. H01L 21/302

(52) U.S. Cl. ............................. 438/9; 438/16; 438/714; 438/717; 216/67; 216/60

(58) Field of Search ............................. 430/5; 438/725, 438/714, 751, 746, 723, 724, 717, 9, 16, 8; 216/67, 79, 60

(56) References Cited

U.S. PATENT DOCUMENTS

| | | | |
|---|---|---|---|
| 5,719,495 A | | 2/1998 | Moslehi |
| 5,733,820 A | * | 3/1998 | Adachi et al. ............... 438/719 |
| 5,773,199 A | * | 6/1998 | Linliu et al. ................ 430/316 |
| 5,891,352 A | | 4/1999 | Litvak |
| 5,909,276 A | | 6/1999 | Kinney et al. |
| 5,912,741 A | | 6/1999 | Carter et al. |
| 6,136,712 A | * | 10/2000 | Klippert II et al. .......... 438/692 |
| 6,340,603 B1 | * | 1/2002 | Bell ............................... 438/9 |
| 6,350,390 B1 | * | 2/2002 | Liu et al. ..................... 216/59 |
| 6,423,457 B1 | * | 7/2002 | Bell ............................. 430/30 |

FOREIGN PATENT DOCUMENTS

JP         11-162820    * 6/1991

OTHER PUBLICATIONS

"Interprocess Run to Run Feedforward Control for Wafer Patterning"; Wagner et al; IEEE Control System Society; 1999; vol. 1; pp. 789–795.*

Arimoto et al, "Monitoring of SRAM Gate Patterns In KrF Lithography By Ellipsometry", IEEE Trans. of Semiconductor Manufacturing, vol. 12(2), pp. 166–169 (1999).

(List continued on next page.)

Primary Examiner—George Goudreau
(74) Attorney, Agent, or Firm—Tung & Associates

(57) ABSTRACT

Within a method for fabricating a microelectronic fabrication there is first provided a substrate. There is then formed over the substrate a blanket target layer. There is then formed over the blanket target layer a patterned mask layer. There is then measured, while employing an optical method, a linewidth of the patterned mask layer to determine a patterned mask layer measured linewidth. There is then determined a deviation of the patterned mask layer measured linewidth from a patterned mask layer target linewidth. There is then etched, while employing a plasma etch method, the blanket target layer to form a patterned target layer while employing the patterned mask layer as a etch mask layer. Within the method, in conjunction the deviation of the patterned mask layer measured linewidth from the patterned mask layer target linewidth there is adjusted within the plasma etch method at least one plasma etch parameter such that a patterned target layer measured linewidth more closely approximates a patterned target layer target linewidth. Similarly, within the method, the measuring of the patterned mask layer measured linewidth while employing the optical method and the adjusting within the plasma etch method of the at least one plasma etch parameter are undertaken in-situ for each substrate within a series of substrates fabricated while employing the plasma etch method. Within a second embodiment of the present invention a blanket target layer thickness is measured while employing an optical method rather than a patterned masking layer linewidth.

5 Claims, 1 Drawing Sheet

OTHER PUBLICATIONS

"Statistical Feedback Control of a Plasma Etch Process"; Mozumder et. al.; IEEE Trans on Semiconductor Mfg.; vol. 7; No. 1, Feb. 1994; pp. 1–11.*

"Linewidth Measurement of Gratings on Photomasks: A Simple Technique"; Naqvi et. al.; Applied Optics; vol. 31; No. 10; pp. 1377–1384.*

* cited by examiner

PLASMA ETCH METHOD FOR FORMING PATTERNED LAYER WITH ENHANCED CRITICAL DIMENSION (CD) CONTROL

CROSS-REFERENCE TO RELATED APPLICATIONS

This application is related to co-assigned applications: (1) Ser. No. 09/507,808, filed Feb. 22, 2000,"Plasma Etch Method for Forming Patterned Layer With Enhanced Critical Dimension (CD) Control" now U.S. Pat. No. 6,350,390; and (2) Ser. No. 09/585,486, filed Jun. 1, 2000, "Plasma Etch Method for Forming Patterned Layer With Enhanced Critical Dimension (CD) Control," the teachings and references from which related co-assigned applications are incorporated herein fully by reference, now abandoned.

BACKGROUND OF THE INVENTION

1. Field of the Invention

The present invention relates generally to methods for forming patterned layers within microelectronic fabrications. More particularly, the present invention relates to methods for forming, with enhanced linewidth control, such as but not limited to enhanced critical dimension (CD) linewidth control, patterned layers within microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and microelectronic device and patterned microelectronic conductor layer dimensions have decreased, it has become increasingly important within the art of microelectronic fabrication to control the linewidth, and in particular the critical dimension (CD) linewidth, of microelectronic devices and patterned microelectronic layers formed within microelectronic fabrications when fabricating microelectronic fabrications. In particular, enhanced critical dimension (CD) linewidth control is significant when forming microelectronic devices and patterned microelectronic layers within microelectronic fabrications since enhanced critical dimension (CD) linewidth control typically provides microelectronic fabrications fabricated with enhanced functionality, enhanced reliability and/or enhanced yield.

While enhanced critical dimension (CD) linewidth control is thus desirable in the art of microelectronic fabrication when forming microelectronic devices and patterned microelectronic layers within microelectronic fabrications, enhanced critical dimension (CD) linewidth control is nonetheless not obtained entirely without problems in the art of microelectronic fabrication when forming microelectronic devices and patterned microelectronic layers within microelectronic fabrications. In that regard, it is often difficult to provide within microelectronic fabrications microelectronic devices and patterned microelectronic layers with enhanced critical dimension (CD) linewidth control, insofar as there often occurs when forming a microelectronic device or a patterned microelectronic layer within a microelectronic fabrication multiple interrelated parameters which affect the linewidth, and in particular the critical dimension (CD) linewidth, of the microelectronic device or the patterned microelectronic layer within the microelectronic fabrication.

It is thus towards the goal of forming within the art of microelectronic fabrication patterned microelectronic layers, such as but not limited to patterned microelectronic layers which may be formed within microelectronic devices, with enhanced linewidth control, and in particular enhanced critical dimension (CD) linewidth control, that the present invention is directed.

Various apparatus and methods have been disclosed in the art of microelectronic fabrication for forming and/or inspecting microelectronic layers which may be fabricated within microelectronic fabrications.

For example, Arimoto et al., in "Monitoring of SRAM Gate Patterns in KrF Lithography by Ellipsometry," IEEE Trans. of Semiconductor Manufacturing, Vol.12(2), pp. 166–69 (1999), discloses a method for monitoring within an integrated circuit microelectronic fabrication a linewidth of a gate electrode pattern within the integrated circuit microelectronic fabrication while avoiding the use of a scanning electron microscopy (SEM) method for monitoring within the integrated circuit microelectronic fabrication the linewidth of the gate electrode pattern within the integrated circuit microelectronic fabrication. To realize the foregoing object, the method employs an ellipsometric method for monitoring within the integrated circuit microelectronic fabrication the linewidth of the gate electrode pattern within the integrated circuit microelectronic fabrication.

In addition, Moslehi, in U.S. Pat. No. 5,719,495, discloses an apparatus which incorporates a sensor for non-invasive in-situ measurement of a series of physical properties of a microelectronic layer formed over a microelectronic substrate employed within a microelectronic fabrication. To realize the foregoing object, the apparatus incorporates the sensor which senses for a beam of radiation incident upon the microelectronic layer an amount of radiation specularly coherently reflected from the microelectronic layer and an amount of radiation scattered incoherently reflected from the microelectronic layer, both of which radiation specularly coherently reflected from the microelectronic layer and radiation scattered incoherently reflected from the microelectronic layer correlate with the physical properties of the microelectronic layer.

Further, Litvak, in U.S. Pat. No. 5,891,352, discloses a method for determining, in-situ, an endpoint when forming while employing a microelectronic fabrication method a microelectronic layer formed over a microelectronic substrate employed within a microelectronic fabrication. To realize the foregoing object, the method may employ an optical detection method, wherein preferably, the optical detection method employs a radiation beam incident upon a surface of the substrate opposite the surface of the substrate over which is formed the microelectronic layer.

Still further, Kinney et al., in U.S. Pat. No. 5,909,276, discloses an optical inspection apparatus and an optical inspection method which provides for efficient and economic inspection within the art of microelectronic fabrication of a surface of a microelectronic substrate or a microelectronic layer employed within the art of microelectronic fabrication. The optical inspection method employs the optical detection apparatus which in turn employs: (1) a blanket illumination of the microelectronic substrate or the microelectronic layer employed within the microelectronic fabrication, while employing a collimated light beam at a grazing incident angle with respect to the microelectronic substrate or the microelectronic layer employed within the microelectronic fabrication, in conjunction with; (2) a collection by a lens of light non-specularly reflected (i.e., scattered) from the collimated light beam; and (3) a classification of the collected light non-specularly reflected by a photodetector array positioned within the focal plane of the lens.

Finally, Carter et al., in U.S. Pat. No. 5,912,741, discloses a scatterometer apparatus which may be employed for measuring within the context of a two dimensional array multi-directional optical reflection characteristics of a surface of a microelectronic layer formed over a microelectronic substrate employed within a microelectronic fabrication, while not moving the microelectronic substrate over which is formed the microelectronic layer. To realize the foregoing object, the scatterometer apparatus employs a radiation source, a pair of radiation reflectors, a radiation detector and a radiation beam steerer.

Desirable in the art of microelectronic fabrication are additional methods and materials which may be employed for forming within microelectronic fabrications microelectronic devices and patterned microelectronic layers with enhanced linewidth control, such as but not limited to enhanced critical dimension (CD) linewidth control, within microelectronic fabrications.

It is towards the foregoing object that the present invention is directed.

SUMMARY OF THE INVENTION

A first object of the present invention is to provide a method for forming within a microelectronic fabrication a patterned microelectronic layer.

A second object of the present invention is to provide a method in accord with the first object of the present invention, where the patterned microelectronic layer is formed with enhanced linewidth control, such as but not limited to enhanced critical dimension (CD) linewidth control.

A third object of the present invention is to provide a method in accord with the first object of the present invention and the second object of the present invention, which method is readily commercially implemented.

In accord with the objects of the present invention, there is provided by the present invention a method for fabricating a microelectronic fabrication. To practice a first embodiment of the present invention, there is first provided a substrate. There is then formed over the substrate a blanket target layer. There is then formed over the blanket target layer a patterned mask layer. There is then measured, while employing an optical method, a linewidth of the patterned mask layer to determine a patterned mask layer measured linewidth. There is then determined a deviation of the patterned mask layer measured linewidth from a patterned mask layer target linewidth. There is then etched, while employing a plasma etch method, the blanket target layer to form a patterned target layer while employing the patterned mask layer as an etch mask layer. Within the first embodiment of the present invention: (1) in conjunction with the deviation of the patterned mask layer measured linewidth from the patterned mask layer target linewidth there is adjusted within the plasma etch method at least one plasma etch parameter such that a patterned target layer measured linewidth more closely approximates a patterned target layer target linewidth; and (2) the measuring of the patterned mask layer measured linewidth while employing the optical method and the adjustment of the at least one plasma etch parameter while employing the plasma etch method are undertaken in-situ for each substrate within a series of substrates fabricated while employing the plasma etch method.

A second embodiment of the present invention provides for measurement of a blanket target layer thickness while employing an optical method, rather than measurement of the patterned mask layer linewidth while employing an optical method, and use of a deviation of the blanket target layer measured thickness from a blanket target layer target thickness when adjusting the at least one plasma etch parameter within the plasma etch method for forming from the blanket target layer the patterned target layer.

The present invention provides a method for forming within a microelectronic fabrication a patterned microelectronic layer, where the patterned microelectronic layer is formed with enhanced linewidth control, such as but not limited to enhanced critical dimension (CD) linewidth control. A first embodiment of the present invention realizes the foregoing object by employing when forming over a substrate employed within a microelectronic a patterned target layer from a blanket target layer formed over the substrate employed within the microelectronic fabrication, and while employing a plasma etch method which employs a patterned mask layer formed over the blanket target layer: (1) a measurement, while employing an optical method, of a linewidth of the patterned mask layer to determine a patterned mask layer measured linewidth; and (2) a determination of a deviation of the patterned mask layer measured linewidth from a patterned mask layer target linewidth, wherein: (1) in conjunction the deviation of the patterned mask layer measured linewidth from the patterned mask layer target linewidth there is adjusted within the plasma etch method at least one plasma etch parameter such that a patterned target layer measured linewidth more closely approximates a patterned target layer target linewidth; and (2) the measuring of the patterned mask layer measured linewidth while employing the optical method and the adjusting of the at least one plasma etch parameter when etching the blanket target layer to form the patterned target layer while employing the plasma etch method are undertaken in-situ for each substrate within a series of substrates fabricated while employing the plasma etch method.

Similarly, within a second embodiment of the present invention, in the alternative of measuring a patterned mask layer measured linewidth while employing the optical method there is in the alternative measured a blanket target layer thickness while employing the optical method. A deviation of the blanket target layer measured thickness from a blanket target layer target thickness is then employed within the plasma etch method for adjusting at least one plasma etch parameter such that a patterned target layer measured linewidth more closely approximates a patterned target layer target linewidth.

The method of the present invention is readily commercially implemented. As will be illustrated within the Description of the Preferred Embodiments which follows, the present invention employs methods and apparatus as are generally known in the art of microelectronic fabrication, but employed within the context of a novel combination to provide the present invention. Since it is a specific ordering of methods which at least in part provides the present invention, rather than the existence of fundamental methods, materials and apparatus which provides the present invention, the method of the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

Figure 1:
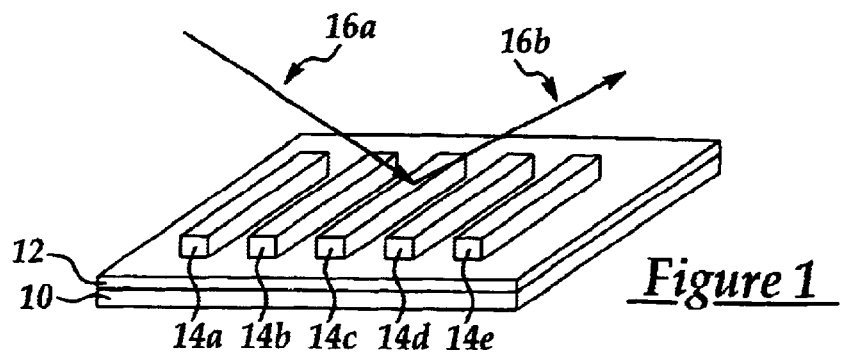
FIG. 1 and FIG. 2 show a pair of schematic perspective view diagrams illustrating the results of forming, in accord with a first preferred embodiment of the present invention, a patterned microelectronic layer within a microelectronic fabrication.

The present invention provides a method for forming within a microelectronic fabrication a patterned microelectronic layer, where the patterned microelectronic layer is formed with enhanced linewidth control, such as but not limited to enhanced critical dimension (CD) linewidth control. A first embodiment of the present invention realizes the foregoing object by employing when forming over a substrate employed within a microelectronic a patterned target layer from a blanket target layer formed over the substrate employed within the microelectronic fabrication, and while employing a plasma etch method which employs a patterned mask layer formed over the blanket target layer: (1) a measurement, while employing an optical method, of a linewidth of the patterned mask layer to determine a patterned mask layer measured linewidth; (2) a determination of a deviation of the patterned mask layer measured linewidth from a patterned mask layer target linewidth, wherein: (1) in conjunction the deviation of the patterned mask layer measured linewidth from the patterned mask layer target linewidth there is adjusted within the plasma etch method at least one plasma etch parameter such that a patterned target layer measured linewidth more closely approximates a patterned target layer target linewidth; and (2) the measuring of the patterned mask layer measured linewidth while employing the optical method and the adjusting of the at least one plasma etch parameter when etching the blanket target layer to form the patterned target layer while employing the plasma etch method are undertaken in-situ for each substrate within a series of substrates fabricated while employing the plasma etch method.

Similarly, within a second embodiment of the present invention, in the alternative of measuring a patterned mask layer measured linewidth while employing the optical method there is measured a blanket target layer thickness while employing an optical method. A deviation of the blanket target layer measured thickness from a blanket target layer target thickness is then employed within the plasma etch method for adjusting at least one plasma etch parameter within the plasma etch method such that a patterned target layer measured linewidth more closely approximates a patterned target layer target linewidth.

Although: (1) the first preferred embodiment of the present invention provides particular value when forming with enhanced linewidth control, such as but not limited to enhanced critical dimension (CD) linewidth control, for use within a semiconductor integrated circuit microelectronic fabrication, a patterned polysilicon layer or a patterned polycide layer for use as a gate electrode within a field effect transistor (FET) for use within the semiconductor integrated circuit microelectronic fabrication, or in the alternative in forming with enhanced linewidth control, such as but not limited to enhanced critical dimension (CD) control, a patterned conductor layer for use within any of various types of microelectronic fabrications; and (2) the second preferred embodiment of the present invention provides particular value when forming with enhanced aperture width (i.e., linewidth) control, such as enhanced critical dimension (CD) aperture width control vias through dielectric layers within microelectronic fabrications, and in particular within integrated circuit microelectronic fabrications, both the first preferred embodiment of the present invention and the second preferred embodiment of the present invention may be employed for forming with enhanced linewidth control within microelectronic fabrications patterned target layers including but not limited to patterned conductor target layers, patterned semiconductor target layers and patterned dielectric target layers, within microelectronic fabrications selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

First Preferred Embodiment

Figure 2:
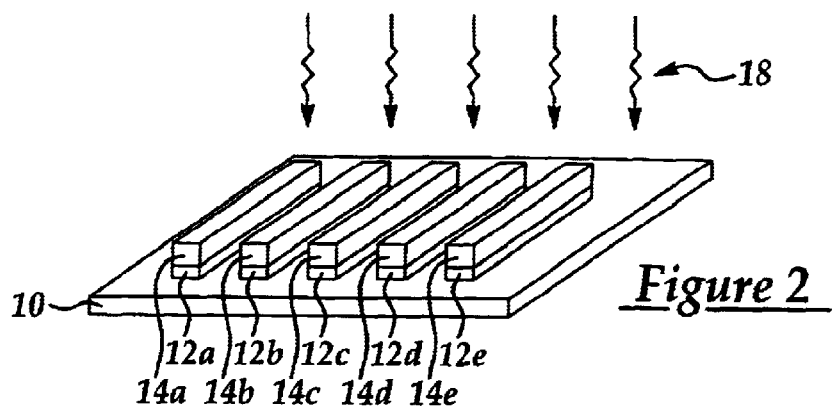

Referring now to FIG. 1 and FIG. 2, there is show a pair of schematic perspective view diagrams illustrating the results of progressive stages of forming, in accord with a first preferred embodiment of the present invention, a patterned microelectronic layer within a microelectronic fabrication. Shown in FIG. 1 is a schematic perspective view diagram of the microelectronic fabrication at an early stage in its fabrication in accord with the first preferred embodiment of the present invention.

Shown in FIG. 1 is a substrate 10 having formed thereover a blanket target layer 12, in turn having formed thereover a series of patterned masking layers 14a, 14b, 14c, 14d and 14e.

Within the first preferred embodiment of the present invention with respect to the substrate 10, the substrate 10 may be employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Although not specifically illustrated within the schematic cross-sectional diagram of FIG. 1, the substrate 10 may consist of the substrate alone as employed within the microelectronic fabrication, or in the alternative, the substrate 10 may comprise the substrate as employed within the microelectronic fabrication, where the substrate has formed thereupon and/or thereover any of several additional microelectronic layers as are conventional within the microelectronic fabrication within which is employed the substrate. Similarly with the substrate alone as employed within the microelectronic fabrication, such additional microelectronic layers may be formed of microelectronic materials including but not limited to microelectronic conductor materials, microelectronic semiconductor materials and microelectronic dielectric materials.

Similarly, although also not specifically illustrated within the schematic cross-sectional diagram of FIG. 1, the substrate 10, typically and preferably, but not exclusively, when the substrate 10 comprises a semiconductor substrate employed within a semiconductor integrated circuit microelectronic fabrication, has formed therein and/or thereupon microelectronic devices as are conventional within the microelectronic fabrication within which is employed the substrate 10. Such microelectronic devices may include, but are not limited to resistors, transistors, diodes and capacitors.

Most typically and preferably, but not exclusively, within the first preferred embodiment of the present invention the substrate 10 either consists of or comprises a semiconductor substrate employed within a semiconductor integrated circuit microelectronic fabrication.

Within the first preferred embodiment of the present invention with respect to the blanket target layer 12, and analogously with the substrate 10, the blanket target layer 12 may similarly also be formed from a microelectronic material selected from the group including but not limited to microelectronic conductor materials, microelectronic semiconductor materials and microelectronic dielectric materials. However, within the first preferred embodiment of the present invention when the substrate 10 consists of or comprises a semiconductor substrate employed within a semiconductor integrated circuit microelectronic fabrication, the blanket target layer 12 will most typically and preferably be formed of a conductor target material, such as but not limited to a doped polysilicon (having a dopant concentration of greater than about 1E18 dopant atoms per cubic centimeter), polycide (doped polysilicon/ metal silicide stack), metal or metal alloy conductor target material which may be employed for forming either a gate electrode within a field effect transistor (FET) employed within the semiconductor integrated circuit microelectronic fabrication or a patterned conductor layer otherwise employed within the semiconductor integrated circuit microelectronic fabrication. Typically and preferably, the blanket target layer 12 is formed to a thickness of from about 1000 to about 4000 angstroms.

Finally, within the first preferred embodiment of the present invention with respect to the patterned masking layers 14a, 14b, 14c, 14d and 14e, the patterned masking layers 14a, 14b, 14c, 14d and 14e may be formed from any of several masking materials as are conventional in the art of microelectronic fabrication, such masking materials being selected from the general groups of masking materials including but not limited to photoresist masking materials, hard masking materials and composites of photoresist masking materials and hard masking materials, although photoresist masking materials are most common and preferred when forming the series of patterned masking layers 14a, 14b, 14c, 14d and 14e. Typically and preferably, the patterned masking layers 14a, 14b, 14c, 14d and 14e when formed of a photoresist masking material will typically and preferably be formed to a thickness of from about 2000 to about 8000 angstroms, and when formed of a hard masking material will typically and preferably be formed to a thickness of from about 300 to about 3000 angstroms.

As is understood by a person skilled in the art, the series of patterned masking layers 14a, 14b, 14c, 14d and 14e is arranged in an ordered grid which may be either: (1) an intrinsic structure within the microelectronic fabrication fabricated in accord with the first preferred embodiment of the present invention (such as an ordered grid employed as a mask for forming a series of gate electrodes or a series of patterned conductor layers within the microelectronic fabrication), or in the alternative; (2) a test structure within the microelectronic fabrication fabricated in accord with the first preferred embodiment of the present invention. Typically and preferably, the ordered grid will have overall areal dimensions of about 50 microns by about 50 microns projected over substrate 10. Similarly, particularly under circumstances where the ordered grid is formed as a test structure within the microelectronic fabrication in accord with the first preferred embodiment of the present invention, the series of patterned masking layers 14a, 14b, 14c, 14d and 14e will typically and preferably have a linewidth and a spacing corresponding with a linewidth and a spacing of a series of patterned target layers desired to be formed from the blanket target layer 12. For advanced microelectronic fabrication applications, such a linewidth of the series of patterned target layer is typically and preferably from about 0.10 to about 0.15 microns while such a spacing within the series of patterned target layers is typically and preferably from about 0.15 to about 0.20 microns.

Finally, there is shown in FIG. 1: (1) an incident radiation beam 16a which is incident upon the ordered grid of the patterned masking layers 14a, 14b, 14c, 14d and 14e (although it is shown as being incident upon only the patterned masking layer 14c); and (2) a reflected radiation beam 16b which is reflected from the ordered grid of the series of patterned masking layers 14a, 14b, 14c, 14d and 14e (although it is shown as being reflected from only the patterned masking layer 14c). Within the first preferred embodiment of the present invention, the incident radiation beam 16a may be provided employing radiation beam sources including but not limited to laser radiation beam sources (of beam diameter from about 1 to about 100 microns) and while light radiation beam sources (of beam diameter from about 1 to about 100 microns) Typically and preferably, the incident radiation beam 16a is incident at an angle of from about 90 to about 30 degrees with respect to the plane of the substrate 10. Within the first preferred embodiment of the present invention, when employing as the incident radiation beam 16a a laser beam there is typically and preferably monitored any of multiple orders of diffracted laser radiation while employing conventional 20 diffraction detection optics, while within the first preferred embodiment of the present invention when the incident radiation beam 16a employs of a polarized white light beam (i.e., broadband 240–800 nm) there is typically and preferably monitored a zeroeth order diffraction reflection while employing standard specular reflection detection optics. For either of the foregoing two options for the incident radiation beam 16a, there is determined within the context of a series of reflected radiation beams (such as the reflected radiation beam 16b) a diffraction pattern from which may be determined a patterned masking layer (such as patterned masking layer 14a, 14b, 14c, 14d and 14e) measured linewidth which is also intended as including a component directed towards a patterned masking layer spacing.

While the above description is directed towards measuring a patterned masking layers 14a, 14b, 14c, 14d and 14e measured linewidth while employing an optical method predicated upon conventional diffraction optics, it is similarly understood by a person skilled in the art that there may also be employed within the first preferred embodiment of the present invention for determining a patterned masking layers 14a, 14b, 14c, 14d and 14e measured linewidth optical methods other than those predicated upon conventional diffraction optics. Such other optical methods may include, but are not limited to reflectance optics, interference optics and ellipsometric optics.

Within the first preferred embodiment of the present invention, it is the intention of the present invention to compensate for a deviation of the patterned masking layers 14a, 14b, 14c, 14d and 14e measured linewidth from a patterned masking layer target linewidth by: (1) establishing a correlation relating the patterned masking layers 14a, 14b, 14c, 14d and 14e target linewidth and at least one plasma etch parameter employed within a plasma etch method for forming a series of patterned target layers from the blanket target layer 12; (2) measuring, in accord with the above optical methods, the patterned masking layers 14a, 14b, 14c, 14d and 14e linewidth to determine a patterned masking layers 14a, 14b, 14c, 14d and 14e measured linewidth and comparing the patterned masking layers 14a, 14b, 14c, 14d and 14e measured linewidth to the patterned masking layers 14a, 14b, 14c, 14d and 14e target linewidth while determining a deviation therebetween; and (3) adjusting the parameter employed in forming the patterned target layers from the blanket target layer 12 such that the patterned target layers are formed with a patterned target layer measured linewidth closer to the patterned target layer target linewidth. Specific examples of such correlations and adjustments are disclosed in greater detail within the related applications which are cross-referenced to the present application, as above, and where, again, the teachings of such related applications are incorporated herein fully by reference. Similarly, in addition to various process parameters as may employed within a plasma etch method for which a correlation may be obtained, such as but not limited to etchant gas flow rate, reactor chamber pressure and radio frequency power, there may also be employed as a correlated parameter within the plasma etch method: (1) a trimming of the patterned masking layers 14a, 14b, 14c, 14d and 14e within a pre-plasma etch method within the plasma etch method; or (2) a sidewall deposition upon the sidewalls of the patterned masking layers 14a, 14b, 14c, 14d and 14e, within a pre-plasma deposition method. Under circumstances where the patterned masking layers 14a, 14b, 14c, 14d and 14e are formed of a photoresist material, such a trimming may be effected while employing an oxygen containing plasma pre-plasma etch method, while such a deposition may be effected while employing a sidewall polymer forming plasma such as may be formed employing a fluorocarbon etchant gas or a bromine containing etchant gas.

It is also an intention of the present invention and the first preferred embodiment of the present invention to compensate for the deviation of the patterned masking layers 14a, 14b, 14c, 14d and 14e from a patterned masking layers 14a, 14b, 14c, 14d and 14e target linewidth while optimally providing a series of substrates, such as the substrate 10, having formed thereover a series of patterned target layers, with optimally uniform patterned target layer measured linewidth within the series of patterned target layers. This aspect of the present invention is realized by: (1) measuring of the patterned masking layers 14a, 14b, 14c, 14d and 14e measured linewidth; and (2) adjusting the at least one plasma etch parameter employed within the plasma etch method for forming from the blanket target layer 12 the patterned target layers sequentially in-situ within a single reactor chamber or multiple interconnected reactor chambers within a single cluster fabrication tool, for each substrate within a series of substrates fabricated while employing the plasma etch method. To assist in achieving this aspect of the present invention, the incident radiation beam 16a source and the reflected radiation beam 16b detection optics are similarly incorporated in-situ within the single reactor chamber or within an adjoining interconnected reactor chamber within the single cluster plasma fabrication tool. In that regard, the incident radiation beam 16a source and the reflected radiation beam 16b detection optics may be incorporated, for example and without limitation, within a substrate orientor location within a plasma fabrication tool, within a plasma reactor chamber within the plasma fabrication tool or within a separate reactor chamber interconnected with the plasma reactor chamber within the plasma reactor tool.

Referring now to FIG. 2, there is shown a schematic perspective view diagram illustrating the results of further processing of the microelectronic fabrication whose schematic perspective view diagram is illustrated in FIG. 1.

Shown in FIG. 2 is a schematic perspective view diagram of a microelectronic fabrication otherwise equivalent to the microelectronic fabrication whose schematic perspective view diagram is illustrated in FIG. 1, but wherein the blanket target layer 12 has been patterned to form a series of patterned target layers 12a, 12b, 12c, 12d and 12e while employing the series of patterned masking layers 14a, 14b, 14c, 14d and 14e as an etch mask layer, in conjunction with use of an etching plasma 18, wherein the at least one parameter within the etching plasma 18 is adjusted to compensate for the deviation of the series of patterned masking layers 14a, 14b, 14c, 14d and 14e measured linewidth as measured employing the optical method as illustrated within and discussed within the context of the schematic perspective view diagram of FIG. 1, from a patterned masking layers 14a, 14b, 14c, 14d and 14e target linewidth such that the patterned target layers 12a, 12b, 12c, 12d and 12e measured linewidth more closely approximate a patterned target layers 12a, 12b, 12c, 12d and 12e target linewidth.

As noted above, within the present invention and the first preferred embodiment of the present invention, the measurement of the patterned masking layers 14a, 14b, 14c, 14d and 14e measured linewidth and the adjusting of the at least one plasma etch parameter within the plasma etch method for forming from the blanket target layer 12 the patterned target layers 12a, 12b, 12c, 12d and 12e are undertaken sequentially in-situ within a single reactor chamber or within adjoining reactor chambers within a multi-chamber reactor tool for each substrate within a series of substrates which is processed while employing the plasma etch method which is employed for forming from the blanket target layer 12 the patterned target layer 12a, 12b, 12c, 12d and 12e.

Upon forming the microelectronic fabrication whose schematic perspective view diagram is illustrated in FIG. 2 from the microelectronic fabrication whose schematic perspective view diagram is illustrated in FIG. 1 while employing the first preferred embodiment of the present invention, there may be provided a series of microelectronic fabrications having formed therein a series of patterned target layers with enhanced linewidth control, such as but not limited to an enhanced critical dimension (CD) linewidth control. The first preferred embodiment of the method of the present invention realizes the foregoing object by employing an optical detection method for measuring a linewidth of a series of patterned masking layers within a microelectronic fabrication and then adjusting within the context of a deviation of a patterned masking layer measured linewidth from a patterned masking layer target linewidth at least one parameter within a plasma etch method for forming a series of patterned target layers from a blanket target layer while employing the patterned masking layer as an etch mask layer, for each substrate within a series of substrates which is processed while employing the plasma etch method.

Second Preferred Embodiment

Figure 3:
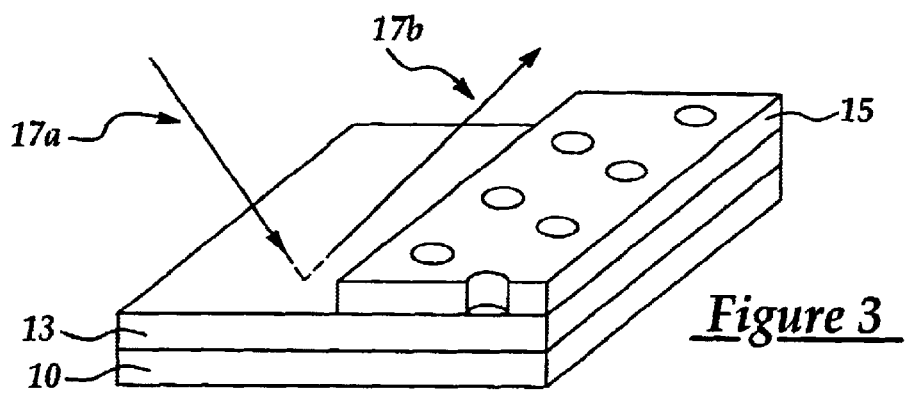
FIG. 3 and FIG. 4 show a pair of schematic perspective view diagrams illustrating the results of forming, in accord with a second preferred embodiment of the present invention, a patterned microelectronic layer within a microelectronic fabrication.
Figure 4:
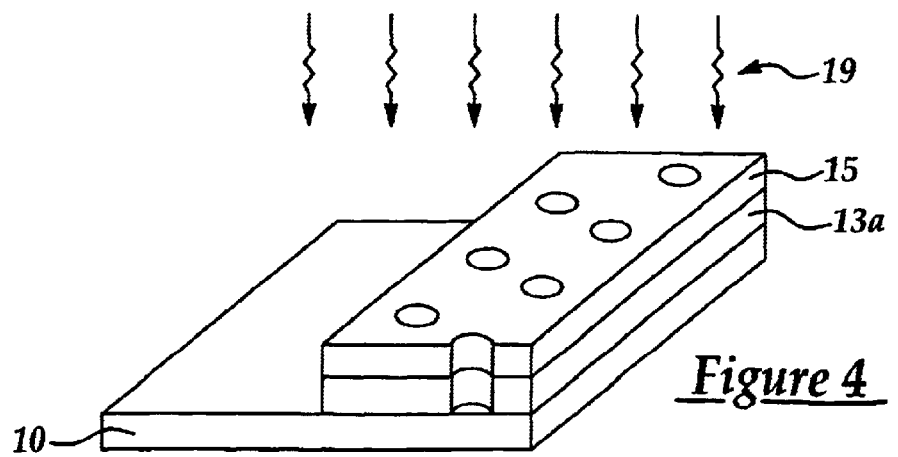

Referring now to FIG. 3 and FIG. 4, there is shown a pair schematic perspective view diagrams illustrating the results of progressive stages in forming in accord with a second preferred embodiment of the present invention a patterned target layer within a microelectronic fabrication. Shown in FIG. 3 is a schematic perspective-view diagram of the microelectronic fabrication at an early stage in its fabrication in accord with the second preferred embodiment of the present invention.

Shown in FIG. 3 is a schematic perspective view diagram of a microelectronic fabrication generally similar to the microelectronic fabrication whose schematic perspective view diagram is illustrated in FIG. 1, but wherein: (1) in place of the blanket target layer 12 formed over the substrate 10 as illustrated within the schematic perspective view diagram of FIG. 1 there is shown a blanket target layer 13 formed over the substrate 10 within the schematic perspective view diagram of FIG. 3; (2) in place of the series of patterned masking layers 14a, 14b, 14c, 14d and 14e formed over the blanket target layer 12 as illustrated within the schematic perspective view diagram of FIG. 1 there is shown a patterned masking layer 15 formed over the blanket target layer 13 as illustrated within the schematic perspective view diagram of FIG. 3; and (3) in place of the incident radiation beam 16a and the reflected radiation beam 16b as illustrated within the schematic perspective view diagram of FIG. 1 there is illustrated an incident radiation beam 17a and a reflected radiation beam 17b illustrated within the schematic perspective view diagram of FIG. 3.

Within the second preferred embodiment of the present invention, the blanket target layer 13 as illustrated within the schematic perspective view diagram of FIG. 3 differs from the blanket target layer 12 as illustrated within the schematic perspective view diagram of FIG. 1 only insofar as the blanket target layer 13 is at least partially transparent to the incident radiation beam 17a such that there may be determined while employing an optical detection method while employing the incident radiation beam 17a and the reflected radiation beam 17b a thickness of the blanket target layer 13. The blanket target layer may otherwise be formed employing methods, materials and dimensions analogous or equivalent to the methods, materials and dimensions as are employed for forming the blanket target layer 12 as employed within the first preferred embodiment of the present invention as illustrated within the schematic perspective view diagram of FIG. 1.

Similarly, within the second preferred embodiment of the present invention with respect to the patterned masking layer 15, the patterned masking layer 15 may be formed employing methods, materials and dimensions analogous or equivalent to the methods, materials and dimensions as employed for forming the series of patterned masking layers 14a, 14b, 14c, 14d and 14e within the first preferred embodiment of the present invention as illustrated within the schematic perspective view diagram of FIG. 1, but wherein the patterned masking layer 15 defines a series of apertures exposing a series of portions of the blanket target layer 13 through which are desired to be formed a series of vias while employing the patterned masking layer 15 as an etch mask layer, in conjunction with a plasma etch method. Similarly, within the second preferred embodiment of the present invention, the patterned masking layer 15 leaves exposed a portion of the blanket target layer 13 of a bidirectional areal dimension from about 1 to about 100 microns, such as to allow for incidence thereupon of the incident radiation beam 17a.

Finally, within the second preferred embodiment of the present invention with respect to the incident radiation beam 17a and the reflected radiation beam 17b, the incident radiation beam 17a may be provided and the reflected radiation beam 17b may be quantified while employing radiation beam sources and radiation detection methods as are employed for providing the incident radiation beam 16a and detecting the reflected radiation beam 16b as illustrated within the schematic perspective view diagram of FIG. 1, but wherein such optical detection of the reflected radiation beam 17b provides instead of a patterned masking layer 15 measured linewidth a blanket target layer 13 thickness.

Thus, within the second preferred embodiment of the present invention, it is a deviation of a blanket target layer 13 measured thickness from a blanket target layer 13 target thickness which is employed within a plasma etch method for forming from the blanket target layer a patterned target layer such that a patterned target layer measured linewidth more closely approximates a patterned target layer target linewidth.

Within the context of the second preferred embodiment of the present invention, it is often difficult to form within a microelectronic fabrication a patterned target layer having formed therethrough a series of low areal density vias with controlled linewidth, since a variation in thickness of the patterned target layer will often contribute to a variation in aperture width of the series of vias. Similarly, within the second preferred embodiment of the present invention, a particularly appropriate parameter within a plasma etch method which might be desirably correlated with a thickness of the blanket target layer to provide a patterned target layer with a patterned target layer measured linewidth closer to a patterned target layer target linewidth is a plasma etch time.

Referring now to FIG. 4, there is shown a schematic perspective view diagram illustrating the results of further processing of the microelectronic fabrication whose schematic perspective view diagram is illustrated in FIG. 3.

Shown in FIG. 4 is a schematic perspective-view diagram of a microelectronic fabrication otherwise equivalent to the microelectronic fabrication whose schematic perspective-view diagram is illustrated in FIG. 3, but wherein the blanket target layer 13 has been patterned etched to form a patterned target layer 13a while employing the patterned masking layer 15 as an etch mask layer, in conjunction with an etching plasma 18.

Similarly with the first preferred embodiment of the present invention, within the second preferred embodiment of the present invention, the etching plasma 18 typically and preferably employs an etchant gas composition appropriate to a material from which is formed the blanket target layer 13.

Upon forming the microelectronic fabrication whose schematic perspective view diagram is illustrated in FIG. 4 from the microelectronic fabrication whose schematic perspective view diagram is illustrated in FIG. 3, there is provided in accord with the second preferred embodiment of the present invention a patterned target layer 13a having formed therein an aperture with an enhanced aperture width (i.e., linewidth) control, such as but not limited to an enhanced critical dimension (CD) aperture width control. The second preferred embodiment of the present invention realizes the foregoing object for reasons analogous or equivalent to the reasons as provided within the context of the first preferred embodiment of the present invention.

As is understood by a person skilled in the art, the preferred embodiments of the present invention are illustrative of the present invention rather than limiting of the present invention. Revisions and modifications may be made to methods, materials, structures and dimensions through which are provided the preferred embodiments of the present invention while still providing embodiments of the present invention which are within the spirit and scope of the present invention, in accord with the accompanying claims.

What is claimed is:

1. A method for fabricating a microelectronic fabrication compromising:

provoding a substrate;

forming over the substrate a blanket target layer;

forming over the blanket target layer a patterned mask layer;

measuring, white employing an optical diffraction method, a linewidth of the patterned mask layer to determine a patterned mask layer measured linewidth;

determining a deviation of the patterned mask layer measured linewidth from a patterned mask layer target linewidth;

etching, while employing a plasma etch method, the blanket target layer to form a patterned target layer while employing the patterned mask layer as a etch mask layer, wherein:

in conjunction with the deviation of the patterned mask layer measured linewidth from the patterned mask layer target linewidth there is adjusted within the plasma etch method at least one plasma etch parameter such that a patterned target layer measured linewidth more closely approximates a patterned target layer target linewidth; and the measuring of the patterned mask layer measured linewidth while employing the optical diffraction method and the adjusting within the plasma etch method of the at least one plasma etch parameter are undertaken in-situ for each substrate within a series of substrates fabricated while employing the plasma etch method.

2. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The method of claim 1 wherein the blanket target layer is formed from a material selected from the group consisting of conductor materials, semiconductor materials and dielectric materials.

4. The method of claim 1 wherein the blanket target layer is formed to a thickness of from about 1000 to about 4000 angstroms.

5. The method of claim 1 wherein the patterned mask layer is formed from a material selected from the group consisting of photoresist mask materials, hard mask materials and composites thereof.

* * * * *